United States Patent [19]
Gerna et al.

[11] Patent Number: 6,016,272
[45] Date of Patent: Jan. 18, 2000

[54] HIGH-PRECISION ANALOG READING CIRCUIT FOR FLASH ANALOG MEMORY ARRAYS USING NEGATIVE FEEDBACK

[75] Inventors: Danilo Gerna, Montagna In Valtellina; Roberto Canegallo, Tortona; Ernestina Chioffi, Pavia; Marco Pasotti, S. Martino Siccomario; Pier Luigi Rolandi, Monleale, all of Italy

[73] Assignee: STMicroelectronicsS. r. l., Agrate Brianza, Italy

[21] Appl. No.: 09/060,165

[22] Filed: Apr. 14, 1998

[30] Foreign Application Priority Data

Apr. 14, 1997 [EP] European Pat. Off. ............ 978301723

[51] Int. Cl.[7] .................................. G11C 16/06
[52] U.S. Cl. .................. 365/185.21; 365/185.2; 365/210
[58] Field of Search ............................ 365/185.21, 185.2, 365/210

[56] References Cited

U.S. PATENT DOCUMENTS

| | | | |
|---|---|---|---|
| 5,616,510 | 4/1997 | Wong | 438/259 |
| 5,699,295 | 12/1997 | Yero | 365/185.21 |
| 5,748,534 | 5/1998 | Dunlap et al. | 365/185.21 |
| 5,859,798 | 1/1999 | Yero | 365/185.25 |

FOREIGN PATENT DOCUMENTS

| | | |
|---|---|---|
| 0 085 260 A2 | 8/1983 | European Pat. Off. . |
| 0 388 752 A2 | 9/1990 | European Pat. Off. . |
| 0 833 348 | 4/1998 | European Pat. Off. ........ G11C 29/00 |
| WO 96/14638 | 5/1996 | WIPO . |

*Primary Examiner*—Andrew Q. Tran
*Attorney, Agent, or Firm*—Theodore E. Galanthay; E. Russell Tarleton; Seed and Berry LLP

[57] ABSTRACT

An analog reading circuit having a current mirror circuit forcing two identical currents into a cell to be read and into a reference cell. An operational amplifier has an inverting input connected to the drain terminal of the cell to be read, a non-inverting input connected to the drain terminal of the reference cell, and an output connected to the gate terminal of the reference cell. The reference cell therefore forms part of a negative feedback loop which maintains the overdrive voltages of the cell to be read and the reference cell constant, irrespective of temperature variations. The reading circuit is also of high precision and has a high reading speed.

20 Claims, 1 Drawing Sheet

HIGH-PRECISION ANALOG READING CIRCUIT FOR FLASH ANALOG MEMORY ARRAYS USING NEGATIVE FEEDBACK

TECHNICAL FIELD

The present invention relates to a high-precision analog reading circuit for memory arrays, in particular flash analog memory arrays.

BACKGROUND OF THE INVENTION

As is known and shown by way of example in FIG. 1, a flash memory array 1 comprises a plurality of flash cells 2 disposed in rows and columns, wherein the gate terminals of the cells 2 disposed in a same row are connected to a respective word line 3, the drain terminals of the cells 2 disposed in a same column are connected to a respective bit line 4 and the source terminals are generally connected to ground. The word lines 3 are connected to a row decoder 5 and the bit lines 4 are connected to a column decoder 6 which receive respective address and control signals from a control unit 7 which enables the selection, each time, of a single word line 3 and a single bit line 4 and thus access to the cell 2 connected to the word line and the selected bit line.

A cell 2 may in particular be read by connecting the selected word line 3 to an external voltage $V_{CPX}$ of predetermined value (for instance 8–9 V) and by forcing a bias current $I_f$ into the selected bit line 4. Maintaining the selected cell in the linear region, the following equation is valid:

$$I_f = K^* (W/L)^*[(V_{CPX}-V_{th})-V_{DS}/2]^*V_{DS} \quad (1)$$

in which K is a constant connected with the manufacturing process, W/L is the width/length dimensional relationship of the cell, $V_{th}$ is the threshold voltage of the cell (i.e., the minimum voltage to be applied between the gate and source terminals of this cell so that it starts to conduct current) and $V_{DS}$ is the drain-source drop of the cell. In (1), the term $K^*(W/L)^*V_{DS}=GM_f$ represents the transconductance (gain) of the cell and the term $(V_{CPX}-V_{th})$ represents the overdrive of the cell.

By appropriately biasing the cell, the drop $V_{DS}$ is constant and the term $V_{DS}/2$ is negligible with respect to the overdrive $(V_{CPX}-V_{th})$; in this condition the current $I_f$ flowing through the cell depends in a linear manner on the threshold voltage $V_{th}$.

During writing, the cell is selected by biasing the connected bit and word lines to respective predetermined programming voltage values. Writing takes place by means of the hot electron injection phenomenon, on the basis of which the high voltage supplied to the drain terminal of the cell to be written causes an increase in the velocity of the electrons and some of these achieve an energy sufficient to overcome the oxide barrier. By forcing a voltage on the gate terminal that is higher than the voltage at the drain terminal, the obtained electric field accelerates the electrons through the oxide layer that separates the channel region from the floating gate region and enables the entrapment of these electrons within the floating gate region. As a result of this entrapment of electrons, the cell modifies its threshold voltage.

The phenomenon of hot electron injection is, by its nature, uncontrolled and cannot be repeated with precision; during programming, the cell is therefore read several times in order to read the achieved threshold voltage (verify phase).

For this reason, an analog memory formed by flash cells has a storage precision that depends on the precision of reading. The threshold voltage is, moreover, highly dependent on the temperature and the manufacturing process used; this means that, in order to obtain a high level of precision and reliability, it is necessary to provide for solutions that ensure substantial insensitivity to variations in operating conditions.

In order to enable high-precision reading of flash memory cells, a preceding European Patent Application 96830612.6 filed on Dec. 5, 1996 in the name of the applicant and entitled "Method and circuit for checking multi-level programming of floating-gate nonvolatile memory cells, particularly flash-cells" discloses a closed-loop circuit in which a current of predetermined value is forced through a first terminal (for instance the drain terminal) of the cell to be read; this first terminal is connected to an input of an operational amplifier that also receives a reference voltage; the second terminal (for instance the source terminal) of the cell is connected to a predetermined potential and the output of the operational amplifier is connected to the gate terminal of the cell. In this way, a voltage directly proportional to the threshold voltage of the cell is present at the output of the operational amplifier and can be compared with the desired threshold voltage in order to decide whether or not to continue programming.

This solution, although precise, raises the problem of the high capacitance associated with the drain terminal of the cell to be read, due to the sum of all the capacitances associated with the cells connected in parallel to the same bit line. This capacitance in effect introduces a pole into the transfer function which slows down the reading. In particular, the maximum speed that can be achieved, in terms of frequency, $F_{MAX}$ is given by the equation:

$$F_{MAX}=GM_f/C_p \quad (2)$$

in which $GM_f$ is the transconductance of the cell, as defined above, and $C_p$ is the capacitance associated with the bit line in question. In (2) $GM_f$ cannot be modified as it depends on design and technology considerations; $C_p$ could be reduced by increasing the voltage applied to the drain terminal of the cell but, in order to avoid the risk of cancellation of the cell, this voltage cannot be excessively increased.

SUMMARY OF THE INVENTION

An object of the invention is therefore to provide a flash memory reading circuit that remedies the drawbacks of known circuits.

The present invention therefore relates to a high-precision analog reading circuit for memory arrays, in particular flash analog memory arrays.

One aspect of the present invention is directed to a high-precision analog reading circuit for reading memory cells, in particular flash cells. The circuit comprises a first and second cell, each having first and second terminals and a control terminal; and a reading circuit that comprises first and second current sources connected to the first and second cells, respectively, for generating first and second currents that are equal to each other, and a negative feedback circuit having first and second inputs connected to the first and second terminals of the first and second cells, respectively, and an output connected to the control terminal of the second cell. Preferably the first cell is an array cell to read and the second cell is a reference cell.

BRIEF DESCRIPTION OF THE DRAWINGS

A preferred embodiment of the present invention is described below, purely by way of non-limiting example, with reference to the accompanying drawings.

DETAILED DESCRIPTION OF THE INVENTION

Figure 1:
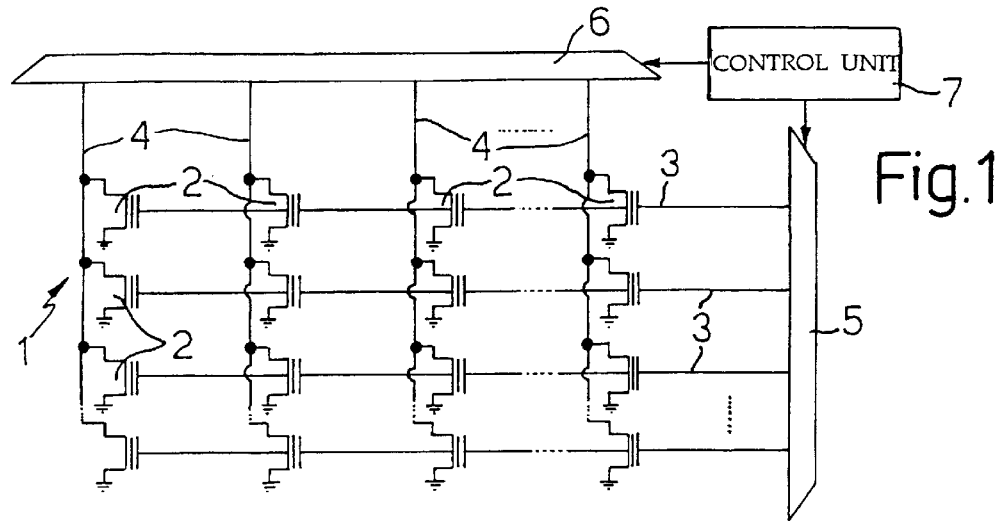
FIG. 1 shows a simplified circuit diagram of a flash memory of known type.
Figure 2:
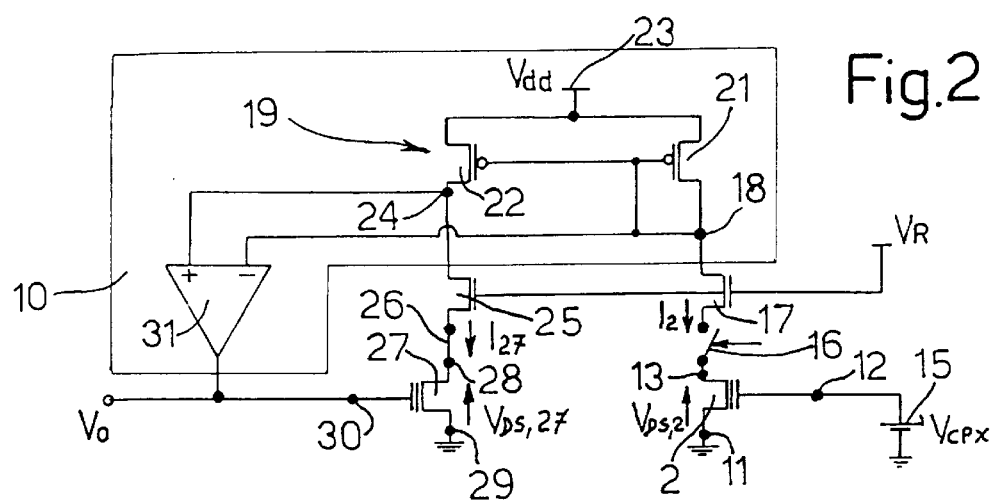
FIG. 2 shows a simplified circuit diagram of the present reading circuit.

FIG. 2 shows a reading circuit 10 (also known as a "sense amplifier") for reading a cell 2 to be read belonging to the memory array 1 shown in FIG. 1. With respect to the memory array 1, FIG. 2 shows, for simplicity, only the cell 2 to be read addressed via the row decoder 5 and the column decoder 6; the row decoder 5 is not shown and only some of the components of the column decoder 6 are shown.

In more detail and as shown in FIG. 2, the cell 2 to be read has a source terminal 11 connected to ground, a gate terminal 12 connected to a voltage source 15 supplying the reading voltage $V_{CPX}$ and a drain terminal 13 connected to a node 18 via a selection switch 16 and a first biasing transistor 17 of NMOS type belonging to the column decoder 6 of FIG. 1. The node 18 is connected to a current mirror circuit 19 formed by two PMOS transistors 21, 22; in more detail, the PMOS transistor 21 is diode-connected (i.e., has its drain and gate terminals short-circuited) and has its drain terminal connected to the node 18, its source terminal connected to the supply line 23 set at $V_{dd}$ and its gate terminal connected to the gate terminal of the PMOS transistor 22; the latter has its source terminal connected to the supply line 23 and its drain terminal connected to a node 24.

The node 24 is connected, via a second biasing transistor 25 again of NMOS type and a dummy switch 26 that is always kept closed, to the drain terminal 28 of a reference cell 27, for instance a virgin cell, having a source terminal 29 connected to ground and a gate terminal 30 connected to the output of an operational amplifier 31; the latter has an inverting input connected to the node 18 and a non-inverting input connected to the node 24.

FIG. 2 also shows some physical quantities useful for the following discussion, in particular the output voltage $V_o$ of the operational amplifier 31 which also forms the output voltage of the reading circuit 10, the voltage drop $V_{DS,2}$ and $V_{DS,27}$ between the drain and source terminals of the cell 2 to be read and the reference cell 27 respectively and the currents $I_2$ and $I_{27}$ flowing through these cells.

The circuit of FIG. 2, as a result of the current mirror circuit 19, forces identical currents into the cell 2 to be read and into the reference cell 27 so that they have the same overdrive voltage. In this situation, the threshold voltage of the cell 2 to be read is proportional to the difference between its gate voltage and that of the reference cell 27 and threshold voltage variations due to temperature variations are identical in the cell 2 to be read and in the reference cell 27 and mutually compensate one another.

In the circuit of FIG. 2, the function of the biasing transistors 17 and 25 is to maintain the cells 2 and 27 in the linear region and to prevent the cancellation of these cells when they are not selected, by keeping the voltage drop between the drain and source terminals of the cells 2 and 27 constant. The reference cell 27 is, moreover, inserted in a negative feedback loop (including, in addition to the reference cell 27 itself, the biasing transistor 25 and the operational amplifier 31) which ensures, via the voltage $V_o$ applied to the gate terminal 30 of the reference cell 27, the same overdrive voltage value for the cell 2 to be read and for the reference cell 27, as described in mathematical terms below.

In more detail, assuming that the cell 2 to be read and the reference cell 27 have been produced in an identical manner using the same technology, on the basis of (1), the current $I_2$ flowing through the cell 2 to be read and the current $I_{27}$ flowing through the reference cell 27 are given by:

$$I_2 = K^*(W/L)^*[(V_{CPX} - V_{th,2}) - V_{DS,2}/2]^* V_{DS,2} \quad (3)$$

$$I_{27} = K^*(W/L)^*[(V_o - V_{th,27}) - V_{DS,27}/2]^* V_{DS,27} \quad (4)$$

in which $V_{th,2}$ and $V_{th,27}$ are the threshold voltages of the cell 2 to be read and the reference cell 27 respectively and the other quantities have the meaning described above.

Supposing that the PMOS transistors 21 and 22 belonging to the current mirror circuit 19 and the biasing transistors 17 and 25 work at saturation, this gives:

$$I_2 = I_{27} \quad (5)$$

In addition, in equilibrium, the voltages at the inputs of the operational amplifier 31 (voltages at the nodes 18 and 24) are equal and, given that the biasing transistors 17, 25 receive, at their gate terminal, the same biasing voltage $V_R$ (of 1.2–1.4 V for instance), they have the same gate-source drop; it follows, disregarding the voltage drop at the terminals of the selection switch 16 and the dummy switch 26, that:

$$V_{DS,2} = V_{DS,27} \quad (6)$$

The following can be obtained from (3) and (4), taking account of (5) and (6):

$$V_{CPX} - V_{th,2} = V_o - V_{th,27} \quad (7)$$

i.e., with the structure shown, the overdrive voltage of the cell 2 to be read is equal to the overdrive voltage of the reference cell 27.

The following can, moreover, be immediately obtained from (7):

$$V_o = V_{CPX} - (V_{th,2} - V_{th,27}) \quad (8)$$

i.e.:

$$V_{th,2} = V_{CPX} - V_o + V_{th,27} \quad (9)$$

It can be seen from (9) that the threshold voltage of the cell 2 to be read depends in a linear manner on the output voltage $V_o$ of the amplifier, as a result of which the reading of this output voltage, as the threshold voltage of the reference cell 27 and the reading voltage applied to the gate terminal of the cell 2 to be read are known, provides the required threshold value.

Precise knowledge of the threshold voltage $V_{th,27}$ of the reference cell 27 is not necessary either. For storing and successively reading the threshold voltage of the cell 2 to be read it is necessary only to know its relative value with respect to the threshold voltage of the reference cell 27, ie., to know the value of the output voltage given by (8). This quantity $V_o$ also has the advantage that it is independent of temperature. Considering the threshold voltage to be due to the sum of two terms, a first at constant temperature (at 300° K.) and a second dependent on temperature, the following relationships are valid for the cell 2 to be read and for the reference cell 27:

$$V_{th,2} = V_{th,2}(300° \text{ K.}) + \beta(T) \quad (10)$$

$$V_{th,27} = V_{th,27}(300° \text{ K.}) + \beta(T) \quad (11)$$

and (8) becomes:

$$V_o = V_{CPX} - [V_{th,2}(300° \text{ K.}) + V_{th,27}(300° \text{ K.})] \quad (12)$$

as a result of which the output voltage $V_o$ is independent of temperature variations.

In the circuit of FIG. 2, at constant temperature conditions, it is not indispensable for the comparable components in the two branches comprising the cell 2 to be read and the reference cell 27 to be matched to one another (i.e., for the pairs 21–22, 17–25, 16–26 and 2–27 to be formed by components identical to one another) given that it is not necessary to know at the output the absolute threshold value but only its relative value, given by the voltage $V_o$ as explained above, and therefore small mismatches between the components of each pair do not affect the precision of reading.

These mismatches do, however, have an impact in the case in which the reading conditions of the cell 2 differ from the writing conditions. Even so, as explained above, any small mismatches do not jeopardize the operation of the reading circuit 10 in this case either.

Let's assume in effect that there is a dimensional difference between the cell 2 to be read and the reference cell 27 that can be summarized by means of a variation $\Delta K$ of the factor K. In this situation, and disregarding the factor $V_{DS,2}/2$, (3) becomes:

$$I_2 = (K + \Delta K)*(W/L)*(V_{CPX} - V_{th,2})*V_{DS,2} \quad (3')$$

If (3') is combined with (4), disregarding the factor $V_{DS,27}/2$ and taking account of (10) and (11), this gives:

$$V_o = V_{CPX} - [V_{th,2}(300° \text{ C.}) - V_{th,27}(300° \text{ C.})] + (\Delta K/K)*V_{CPX} + -(\Delta K/K)*V_{th,2} - (\Delta K/K)*\beta(T) \quad (13)$$

In (13), the first three terms are identical to (8), the fourth and fifth terms are constant and do not influence the precision of the reading device, as described above, and the sixth term $(\Delta K/K)*\beta(T)$ is the only temperature-dependent term; as shown, however, any change $\beta$ of the threshold voltage due to temperature is reflected at the output reduced by the term $(\Delta K/K)$ and therefore in de-amplified mode.

In the reading circuit of FIG. 2, the loop formed by the operational amplifier 31, the reference cell 27, the switch 26, the biasing transistor 25 and the PMOS transistor 22 forms a two-stage amplifier, whose first stage is formed by the operational amplifier 31 and whose second stage uses the reference cell 27 as an amplifier member. The biasing transistor 25 operates as a cascode member which supplies a high impedance to the output of the loop (node 24). This two-stage amplifier is thus compensated in the manner shown in the more detailed diagram of FIG. 3 as described below.

Figure 3:
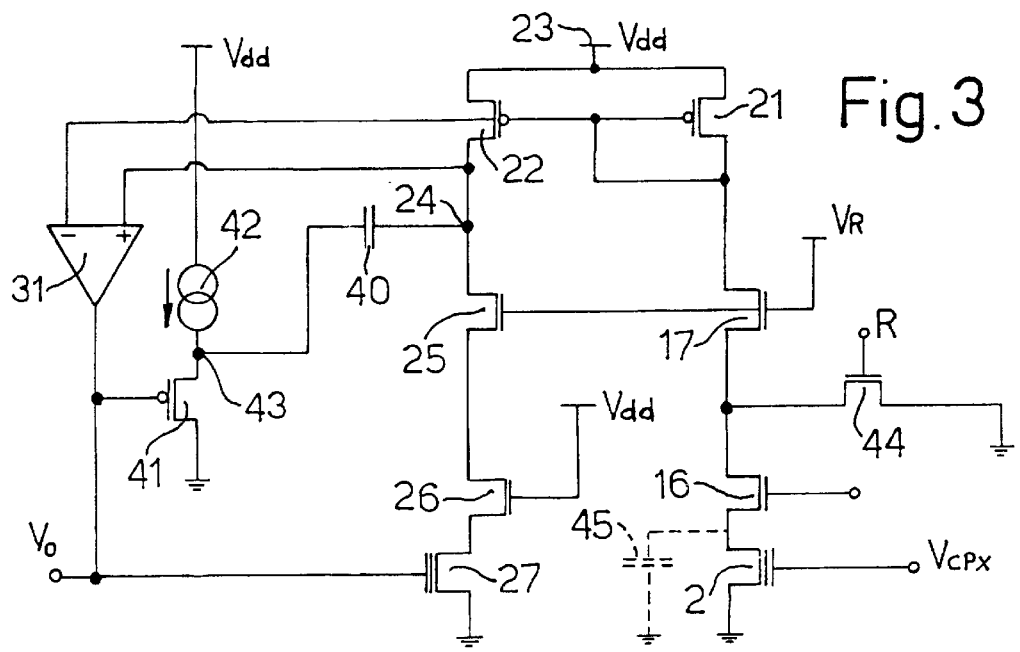
FIG. 3 shows a more detailed circuit diagram of the present circuit.

FIG. 3 shows, in addition to the elements of FIG. 2, a compensating capacitor 40, a compensating transistor 41 and a current source 42. In more detail, the compensating capacitor 40 is connected between the node 24 and a node 43; the current source 42 is disposed between the supply line 24 and the node 43 and the compensating transistor 41 of PMOS type has its source terminal connected to the node 43, its gate terminal connected to the output of the operational amplifier 31 and its drain terminal connected to ground.

Lastly, in FIG. 3, a capacitor 45, shown in dashed lines, represents the parasitic capacitance of the bit line to which the cell 2 to be read is connected; FIG. 3 also shows the transistors (of NMOS type) that form the switches 16 and 26 and a reset transistor 44 of NMOS type having its drain terminal connected to the intermediate node between the transistors 16 and 17, its source terminal connected to ground and its gate terminal receiving a control signal R.

The compensating capacitor 40 gives rise to a pole at the Miller frequency, as a result of which the cut-off frequency of the amplifier formed by the members 22, 25, 26, 27 and 31 and by the capacitor 40 (disregarding, for the time being, the compensating capacitor 41) has a cut-off frequency $F_{CO}$ of:

$$F_{CO} = \frac{1}{2\pi} \frac{GM_{OA}}{C_C}$$

in which $GM_{OA}$ is the transconductance of the operational amplifier and $C_C$ is the capacitance of the capacitor 41.

The capacitor 40 gives rise, however, to a second pole at the frequency $F_{II-P}$ of:

$$F_{II-P} = \frac{1}{2\pi} \frac{GM_f}{C_D}$$

in which $GM_f$ is the transconductance of the reference cell 27, as defined above, and $C_D$ is the capacitance associated with the node 24.

For reasons of stability, the cut-off frequency $F_{CO}$ must be at maximum equal to half the second pole frequency $F_{II-P}$ such that this second pole frequency represents the main factor influencing the reading speed. The transconductance $GM_f$ of the reference cell 27, of flash type, is very low and around 3–4 μA/V but fortunately the parasitic capacitance $C_D$ of the node 24 is low given that there is no load. This consequently makes it possible to obtain a decidedly high reading speed.

The compensating capacitor 40 also gives rise to a right-plane zero at the frequency FZ of:

$$F_z = \frac{1}{2\pi} \frac{GM_f}{C_c}$$

As is known to persons skilled in the art, this zero causes a delay of 90° as a result of which the loop, in the absence of the compensating transistor 41, would become unstable. This problem is resolved by the presence of the compensating transistor 41 which acts as a buffer in emitter-follower configuration and uncouples the output of the second stage of the amplifier (node 24) from the compensating capacitor 40.

Some advantages of the described reading circuit are the following. The structure described, by ensuring the same overdrive with respect to the cell 2 to be read and the reference cell 27, ensures that the threshold voltage of the cell to be read is linked to the difference between the gate voltages of the cell to be read and the reference cell; moreover, the possibility of using, as an operating quantity at the verify phase and during reading, the output voltage $V_o$ of the operational amplifier 31 rather than, directly, the threshold voltage of the cell to be read means that the quantity used is temperature-compensated. The use of the reference cell 27 within the feedback loop rather than the cell 2 to be read makes it possible substantially to increase the reading speed, given the lower capacitance associated with the reference cell 27 on its own with respect to the capacitance associated with the cell 2 to be read. Lastly, as mentioned above, the described reading circuit has good stability, with a simple and reliable structure.

It is evident that many variations and modifications may be made to the reading circuit described and illustrated here, all of which come within the scope of the invention.

We claim:

1. A high-precision analog reading circuit for reading memory cells, in particular flash cells, comprising a first and a second cell, said first cell is an array cell to be read and said second cell is a reference cell, each cell having a first and a second terminal and a control terminal, first and second current source means connected to said first and second cells respectively and generating first and second currents respectively that are equal to each other, and negative feedback means having a first and a second input connected to said first terminal of said first cell and to said first terminal of said second cell respectively and an output connected to said control terminal of said second cell.

2. The circuit of claim 1 wherein said negative feedback means comprise an operational amplifier having an inverting input connected to said first terminal of said first cell and a non-inverting input connected to said first terminal of said second cell.

3. The circuit of claim 1 wherein said first and second current source means form a current mirror circuit.

4. The circuit of claim 1 wherein said first and second current source means are connected to said first terminal of said first cell and to said first terminal of said second cell respectively.

5. The circuit of claim 4, further comprising a first and a second biasing transistor interposed between said first current source means and said first terminal of said first cell and between said second current source means and said first terminal of said second cell respectively, said first and second biasing transistors having respective control terminals connected reciprocally and receiving a common biasing signal.

6. The circuit of claim 1 wherein said first terminal of said first and second cells is a drain terminal, said second terminal of said first and second cells is a source terminal and said control terminal of said first and second cells is a gate terminal.

7. A high-precision analog reading circuit for reading memory cells, in particular flash cells, including a first and a second cell each having a first and a second terminal and a control terminal, said reading circuit comprising first and second current source means connected to said first and second cells respectively and generating first and second currents respectively that are equal to each other, and negative feedback means having a first and a second input connected to said first terminal of said first cell and to said first terminal of said second cell respectively and an output connected to said control terminal of said second cell; and a compensation circuit interposed between said first terminal of said second cell and said output of said negative feedback means.

8. The circuit of claim 7 wherein said compensation circuit comprises a compensating capacitor and a compensating transistor, said compensating capacitor having a first terminal connected to said first terminal of said second cell and a second terminal connected to a first terminal of said compensating transistor, said compensating transistor having a control terminal connected to said output of said negative feedback means.

9. A high-precision analog reading circuit for reading memory cells, comprising:
   a memory cell having first and second terminals and a control terminal;
   a reference cell having first and second terminals and a control terminal;
   a first current source connected to said first terminal of said reference cell and a second current source connected to said first terminal of said memory cell;
   an operational amplifier having an inverting input connected to said first terminal of said memory cell and a non-inverting input connected to said first terminal of said reference cell, and an output connected to said control terminal of said reference cell; and
   a first biasing transistor interposed between said first current source and said first terminal of said reference cell and a second biasing transistor interposed between said second current source and said first terminal of said memory cell, said first and second biasing transistors having respective control terminals connected reciprocally and receiving a common biasing signal.

10. The circuit of claim 9 wherein said control terminal of said memory cell is connected to a voltage source for supplying a reading voltage, and said second terminal of said memory cell is connected to a ground voltage, and further wherein said reference cell has the second terminal connected to said ground voltage.

11. The circuit of claim 9, further comprising a compensation circuit connected between said first terminal of said reference cell and said operational amplifier output.

12. The circuit of claim 11 wherein said compensation circuit comprises a compensating capacitor and a compensating transistor, said compensating capacitor having a first terminal connected to said first terminal of said reference cell and a second terminal connected to a first terminal of said compensating transistor, and said compensating transistor having a control terminal connected to said operational amplifier output.

13. The circuit of claim 12, further comprising a third current source connected to said first terminal of said compensating transistor, and further wherein a second terminal of said compensating transistor is grounded.

14. A high-precision analog reading circuit comprising:
   first and second cells each having gate, source, and drain terminals;
   a current mirror comprising first and second current sources connected to said drain terminals of said first and second cells, respectively;
   first and second biasing transistors interposed between said first and second cells and said current mirror and having gate terminals commonly connected to a voltage source;
   an operational amplifier having an inverting input connected to an output of said first current source, a non-inverting input connected to an output of said second current source, and an output connected to said gate terminal of said second cell; and
   first and second switches connected between drain terminals of said first and second cells, respectively, and source terminals of said first and second biasing transistors, respectively.

15. The circuit of claim 14 wherein said second switch comprises a transistor having a gate terminal connected to a second voltage source to maintain said transistor in a conducting state.

16. The circuit of claim 14, further comprising a compensation circuit having a compensation transistor and a compensation capacitor, said compensation transistor having a gate terminal connected to said operational amplifier output and a drain terminal connected to said compensation capacitor, said compensation capacitor being further connected to said output of said second current source.

17. The circuit of claim 16, further comprising a third current source connected to said drain terminal of said compensation transistor.

18. The circuit of claim 14, further comprising a control element having a first terminal connected to said first biasing transistor and said first switch, and a control terminal for receiving a control signal.

19. The circuit of claim 18 wherein said control element comprises a transistor, and further wherein said first terminal is a drain terminal, and said control terminal is a gate terminal.

20. A high-precision analog reading circuit for reading memory cells, comprising a first and a second cell, said first cell comprising an array cell to be read and said second cell comprising a reference cell, each cell having a first and a second terminal and a control terminal, first and second current sources connected to said first terminal of said first cell and to said first terminal of said second cell, respectively, and generating first and second currents that are equal to each other, and negative feedback means having a first and a second input connected to said first terminal of said first cell and to said first terminal of said second cell, respectively, and an output connected to said control terminal of said second cell, a first and a second biasing transistor interposed between said first current source and said first terminal of said first cell and between said second current source and said first terminal of said second cell, respectively, said first and second biasing transistors having respective control terminals connected reciprocally and receiving a common biasing signal.

* * * * *

UNITED STATES PATENT AND TRADEMARK OFFICE
CERTIFICATE OF CORRECTION

PATENT NO : 6,016,272
DATED : January 18, 2000
INVENTOR(S) : Danilo Gerna et al.

It is certified that error appears in the above-identified patent and that said Letters Patent are hereby corrected as shown below:

On the front cover of the issued patent, section [30], the foreign priority application number should read --97830172--.

Signed and Sealed this

Tenth Day of April, 2001

Attest:

NICHOLAS P. GODICI

*Attesting Officer*   *Acting Director of the United States Patent and Trademark Office*